(12) United States Patent
Zang et al.

(10) Patent No.: US 10,157,927 B2
(45) Date of Patent: Dec. 18, 2018

(54) SEMICONDUCTOR MEMORY DEVICES HAVING AN UNDERCUT SOURCE/DRAIN REGION

(71) Applicant: GLOBALFOUNDRIES Inc., Grand Cayman (KY)

(72) Inventors: Hui Zang, Guilderland, NY (US); Manfred Eller, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 93 days.

(21) Appl. No.: 15/404,754

(22) Filed: Jan. 12, 2017

(65) Prior Publication Data

US 2018/0197867 A1 Jul. 12, 2018

(51) Int. Cl.
| | |
|---|---|
| H01L 27/088 | (2006.01) |
| H01L 27/108 | (2006.01) |
| H01L 21/8234 | (2006.01) |
| H01L 27/06 | (2006.01) |
| H01L 29/78 | (2006.01) |

(52) U.S. Cl.
CPC ........ *H01L 27/10826* (2013.01); *H01L 21/823418* (2013.01); *H01L 21/823431* (2013.01); *H01L 21/823437* (2013.01); *H01L 21/823481* (2013.01); *H01L 27/0629* (2013.01); *H01L 27/0886* (2013.01); *H01L 27/10855* (2013.01); *H01L 29/785* (2013.01)

(58) Field of Classification Search
CPC .................................................. H01L 27/0886
USPC ......................................... 257/298; 438/239
See application file for complete search history.

(56) References Cited

U.S. PATENT DOCUMENTS

| | | | |
|---|---|---|---|
| 2010/0127351 A1* | 5/2010 | Quinn | H01L 23/5223 257/534 |
| 2010/0213522 A1 | 8/2010 | Cheng et al. | |
| 2015/0263128 A1* | 9/2015 | Basker | H01L 29/6681 257/288 |
| 2016/0118458 A1 | 4/2016 | Zang et al. | |

* cited by examiner

*Primary Examiner* — Jami V Miller
(74) *Attorney, Agent, or Firm* — Heslin Rothenberg Farley & Mesiti P.C.; Stephen Scuderi (57) ABSTRACT

A semiconductor memory device includes, for example, a substrate having a fin having a web portion extending from the substrate and a first overhanging fin portion extending outward from the web portion and spaced from the substrate, the fin comprising a source/drain region in the web portion of the fin, a first source/drain region in the first overhanging fin portion, an isolation material surrounding the web portion and disposed under the first overhanging fin portion of the fin, an upper surface of the isolation material being below an upper surface of the fin, a first gate disposed over the fin between the source/drain region in the web portion of the fin and the first source/drain region in the first overhanging fin portion of the fin, and a capacitor operably electrically connected to the first source/drain region in the first overhanging fin portion.

13 Claims, 10 Drawing Sheets

SEMICONDUCTOR MEMORY DEVICES HAVING AN UNDERCUT SOURCE/DRAIN REGION

TECHNICAL FIELD

The present disclosure relates generally to semiconductor devices and methods for forming semiconductor devices, and more particularly, to semiconductor memory devices having an undercut source/drain region such as for use in DRAM (dynamic random access memory) memories and in eDRAM (embedded dynamic random access memory) memories.

BACKGROUND OF THE DISCLOSURE

A DRAM memory is a type of random access memory that stores each bit of data in a separate capacitor of a DRAM storage cell within a large array of cells of an integrated circuit. eDRAM memory is a DRAM integrated with logic circuits on the same die or chip to achieve high performance of an integrated circuit (i.e., very fast read or write operations, etc.) relative to conventional separate logic chips and DRAM chips. Therefore, integrated circuits with eDRAM have a higher content of logic circuit elements (e.g., using standard cell libraries, IPs, or the like) integrated into the logic process.

SUMMARY OF THE DISCLOSURE

The shortcomings of the prior art are overcome and additional advantages are provided through the provision of a method which includes, for example, providing a substrate having a plurality of spaced-apart elongated fins having a plurality of respective hard masks disposed thereon and fill material disposed therebetween, forming a plurality of vertical cavities across upper portions of the plurality of fins, the fill material, and the hard masks, forming spacers along vertical surfaces of the plurality of cavities across upper portions of the plurality of fins, the fill material, and the hard masks, enlarging the plurality of cavities below and away from the spacers, and removing the spacers and the fill material to define the substrate having a plurality of spaced-apart T-shaped fins disposed thereon.

In another embodiment, a method includes, for example, providing a substrate having a fin having a web portion extending from the substrate and a first overhanging fin portion extending outward from the web portion and spaced from the substrate, forming a first source/drain region in the first overhanging fin portion, forming a source/drain region in the web portion of the fin, providing an isolation material surrounding the web portion and disposed under the first overhanging fin portion of the fin, an upper surface of the isolation material being below an upper surface of the fin, forming a first gate over the fin between the first source/drain region and the source/drain region in the web portion of the fin, and connecting a capacitor to the first source/drain region in the overhanging fin portion.

In another embodiment, a semiconductor device includes, for example, a substrate having a fin having a web portion extending from the substrate and a first overhanging fin portion extending outward from the web portion and spaced from the substrate, the fin includes a source/drain region in the web portion of the fin, a first source/drain region in the first overhanging fin portion, an isolation material surrounding the web portion and disposed under the first overhanging fin portion of the fin, an upper surface of the isolation material being below an upper surface of the fin, a first gate disposed over the fin between the source/drain region in the web portion of the fin and the first source/drain region in the first overhanging fin portion of the fin, and a capacitor operably electrically connected to the first source/drain region in the first overhanging fin portion.

Additional features and advantages are realized through the techniques of the present disclosure. Other embodiments of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

Embodiments of the present disclosure and certain features, advantages, and details thereof, are explained more fully below with reference to the non-limiting examples illustrated in the accompanying drawings. Descriptions of well-known materials, processing techniques, etc., are omitted so as not to unnecessarily obscure the disclosure in detail. It should be understood, however, that the detailed description and the specific examples, while indicating embodiments of the present disclosure, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure in some embodiments is directed to semiconductor memory devices having an undercut source/drain region. For example, semiconductor memory devices having an undercut source/drain region may be configured as a FinFET eDRAM device having an undercut source/drain region resulting in improved data retention time and reduced junction leakage current. Additional benefits may include lower cost and good heat dissipation. A technique of the present disclosure is to provide increased resistance below one of a source/drain region by providing a semiconductor memory device having an undercut source/drain region. Computer simulation of an eDRAM structure according the present disclosure indicate a possible 25 time reduction in current leakages (corresponding to about a 25 times longer retention time) compared to eDRAM having a conventional source/drain that does not have an undercut source/drain region.

Figure 1:
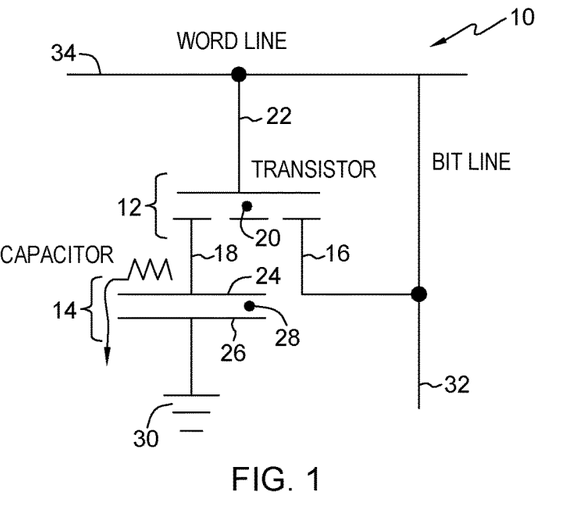
FIG. 1 is a schematic diagram of a semiconductor memory device according to an embodiment of the present disclosure.

FIG. 1 is an electrical schematic diagram of a memory cell 10 such as an eDRAM cell according to an embodiment of the present disclosure. Memory cell 10 may include a transistor 12 and a storage capacitor 14. Transistor 12 includes source 16, a drain 18 and a channel 20 connected therebetween. Transistor 12 also includes a gate 22, operable to control electrical conduction through channel 20 and between source 16 and drain 18. Capacitor 14 includes a first terminal 24 and a second terminal 26 which are electrically separated by a capacitor dielectric 28. Dielectric 28 has a geometric shape and dielectric constant (or k value) that is operable to store a predetermined charge between terminals 24 and 26. Retention time of the stored charge is dependent on junction leakage current JL. Terminal 24 of capacitor 14 is connected to drain 18 of transistor 12. Terminal 26 of capacitor 14 is connected to a system electrical ground 30. Source 16 of transistor 12 is connected to a bit line 32. Gate 22 of transistor 12 is connected to a word line 34.

In operation, a voltage is applied to word line 34 to activate gate 22 and turn on channel 20, thereby electrically connecting storage capacitor 14 to bit line 32. This allows high and low logic voltage levels (representing logic state "1" and "0") to be transferred between storage capacitor 14 and bit line 32.

A plurality of memory cells 10 may be typically arranged in arrays (not shown) of rows and columns that can range from a few cells to many thousands of cells in an array. The rows of the arrays generally function as word lines 34, which may be electrically connected in common with many gates 22 of many transistors 12. The columns of the arrays generally function as bit lines 32, which may be electrically connected in common with many sources 16 of many transistors 12. However, each memory cell 10 may have only one storage (or cell) capacitor 14 associated with it and not connected in common with either word line 34 or bit line 32. A plurality of memory cells 10 may make up an eDRAM memory chip.

Figure 2:
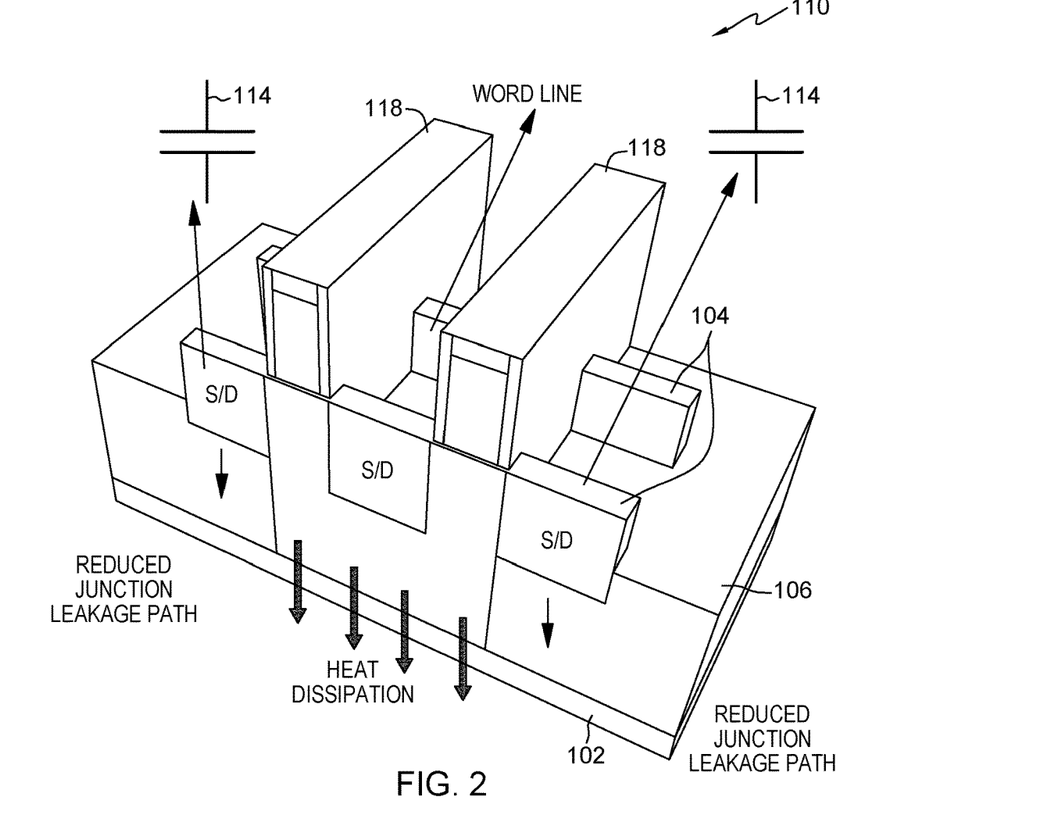
FIG. 2 is a perspective and schematic view of a semiconductor memory device having undercut source/drain regions according to an embodiment of the present disclosure.

FIG. 2 is a three-dimensional perspective and schematic view of a semiconductor memory device 110 having undercut source/drain regions according to an embodiment of the present disclosure. For example, semiconductor memory device 110 may be operable as per the memory cell 10 of FIG. 1 and a plurality of such semiconductor memory devices may be employed in an eDRAM memory chip.

As shown in FIG. 2, semiconductor memory device 110 may include a bulk semiconductor substrate 102 with a plurality of spaced-apart longitudinally-extending fins 104 coupled to the substrate and surrounded at a lower portion thereof by an isolation material 106. A plurality of source/drain regions may be formed in the longitudinally-extending fins. One or more gates 118 may be disposed over the fins. Some of the source/drain regions may be electrically connected to a respective capacitor 114. As illustrated in FIG. 2, since a portion of isolation material 106 is disposed below a source/drain region in an overhanging fin portion of fin 104, the isolation material below the overhanging fin portion fin acts to reduce leakage from the capacitor. The technique of the present disclosure may reduce leakage in a storage capacitor for memory cells such as DRAM cells and eDRAM cells by increasing the electrical resistance below source/drain regions electrically connected to respective capacitors.

FIGS. 3-15 illustrate a method for use in fabricating a semiconductor memory device such as semiconductor memory device 110 (FIG. 2) according to an embodiment of the present disclosure.

Figure 3:
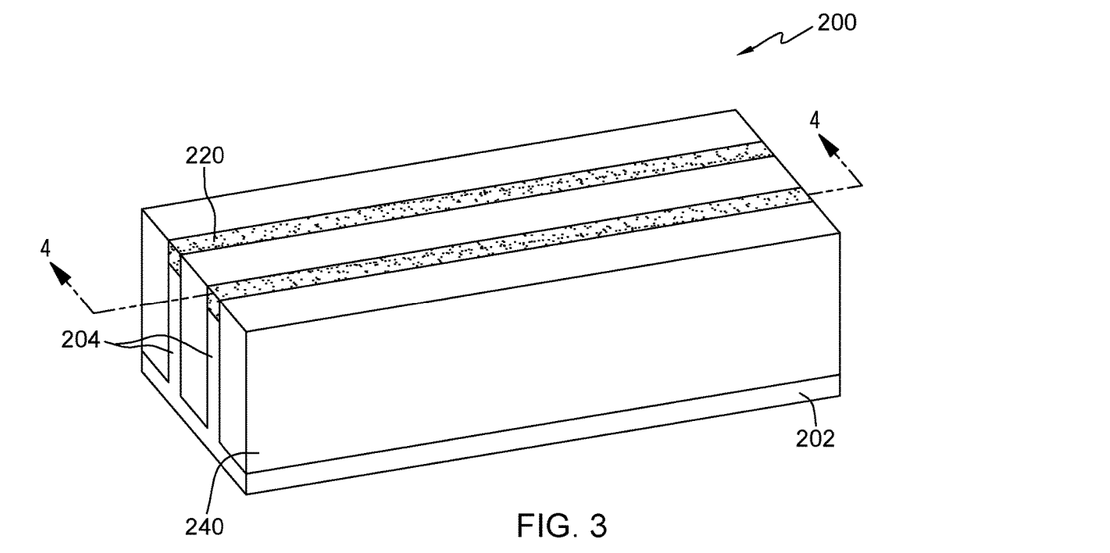
FIGS. 3-15 are perspective and cross-sectional views of a method for forming a semiconductor memory device having undercut source/drain regions according to an embodiment of the present disclosure.
Figure 4:
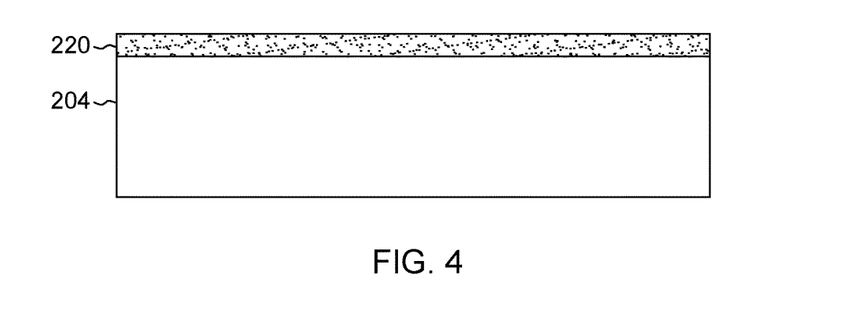

Initially, as shown in FIGS. 3 and 4, an intermediate structure 200 (FIG. 3) may include a plurality of spaced-apart longitudinally-extending fins 204 extending horizontally across a substrate 202, hard masks 220 disposed on fins 204, and a fill material 240 disposed between the fins and the hard masks. The plurality of spaced apart fins may be disposed in a parallel arrangement or other suitable arrangements. As one skilled in the art will understand, where, as in the present example, many fins may be formed and repeated a large number of times across the substrate such as a wafer and processed according to the description below.

The substrate may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Fins 204 may be formed by removing one or more portions of a substrate, creating openings therein thereby creating one or more fins from the same material as the substrate. In one example, formation of the fins may be achieved by patterning a protective material or layer resulting in hard masks 220, to form a plurality of spaced-apart hard masks, disposed on a substrate using any of various approaches, including: direct lithography; sidewall image transfer technique; extreme ultraviolet technique (EUV); e-beam technique; litho-etch litho-etch; or litho-etch litho-freeze. Following patterning, the removal of portions of the substrate may be performed, for example, by any suitable etching process, such as an anisotropic dry etching process, for instance, reactive-ion-etching (RIE) in sulfur hexafluoride ($SF_6$). In one embodiment, the protective material or layer may be or include a nitride material such as, for instance, silicon nitride (SiN or $Si_3N_4$) or silicon oxynitride (SiON). By way of specific example, a protective material or layer may be deposited over the silicon substrate using any conventional deposition processes such as chemical vapor deposition (CVD), physical vapor deposition (PVD), atomic layer deposition (ALD) or plasma-enhanced versions of such processes. The protective material or layer may be provided to protect the underlying silicon substrate from damage during subsequent etch processes, and depending on the fabrication process, may also prevent the silicon substrate from being oxidized by exposure to an oxygen-containing environment during device fabrication. It will be appreciated the fins may be formed on or from a bulk substrate structure in any suitable manner.

Fill material 240 may be a flowable oxide. After forming the fins, fill material 240 may be disposed between substrate 202, fins 204, and hard masks 220. As such, an upper surface of fill material 240 may correspond to the upper surface of hard masks 220.

Figure 5:
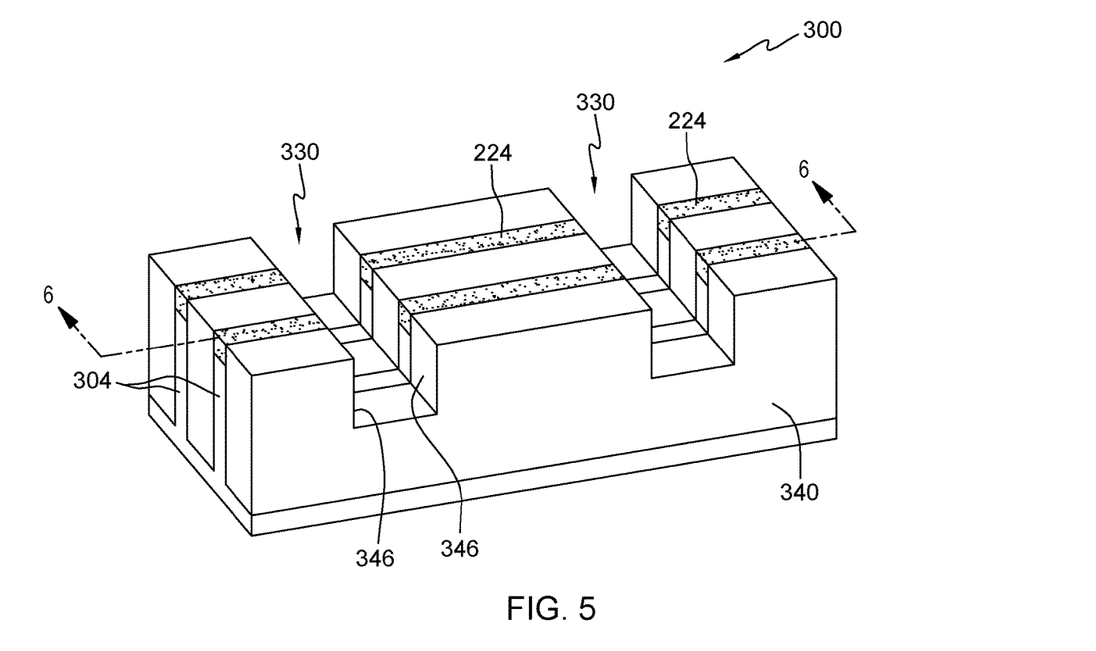
Figure 6:
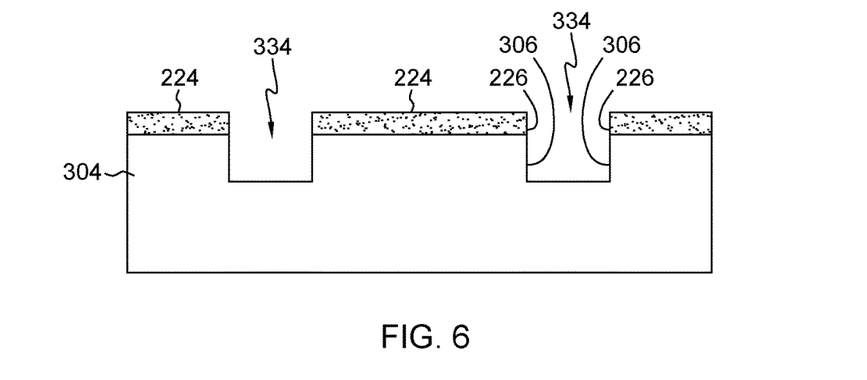

As shown in FIGS. 5 and 6, a plurality of trenches or cavities 330 (FIG. 5) is formed in and extend across structure 200 (FIG. 3) to form intermediate structure 300 (FIG. 5). For example, plurality of trenches or cavities 330 (FIG.

5) may be formed in and extend across fins 204 (FIGS. 3 and 4), fill material 240 (FIGS. 3 and 4), and hard masks 220 (FIGS. 3 and 4) to form a plurality of fins 304 having cavities 334 (FIG. 6). The upper portions of fins 304 between cavities 334 include hard mask portions 224. For example, a patterned etch process may be employed to form the cavities. A suitable etch process may be an HF etch.

Figure 7:
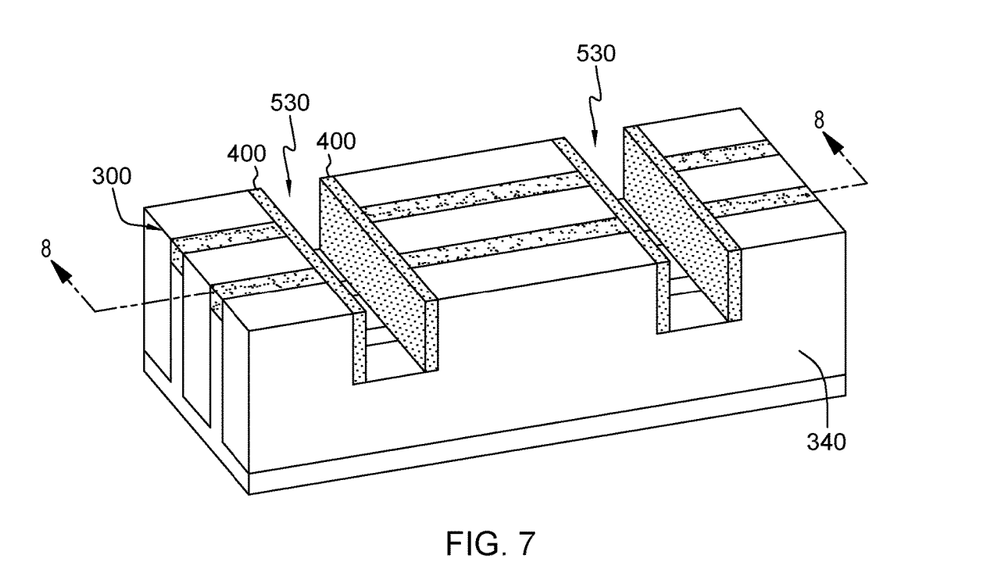
Figure 8:
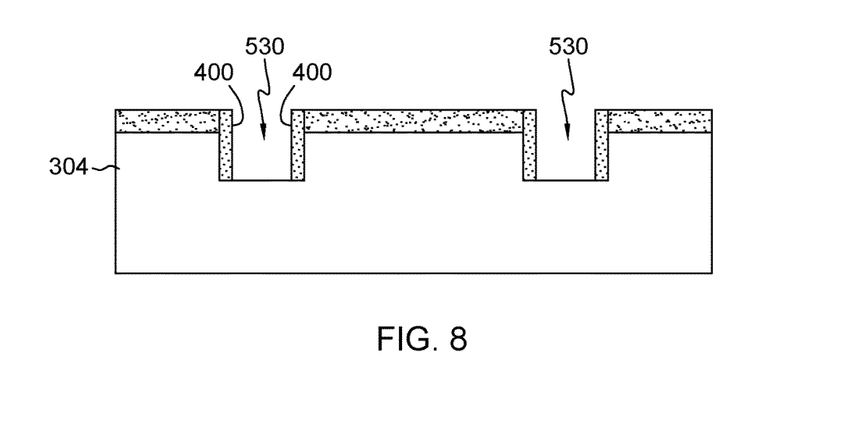

With reference to FIGS. 7 and 8, a plurality of spacers 400 are formed along the vertical sides of cavities 330 (FIG. 5) of intermediate structure 300. For example, spacers 400 may be formed along the vertical sides 306 (FIG. 6) of fins 304 (FIG. 6), vertical sides 346 (FIG. 5) of fill material 340 (FIG. 5), and vertical sides 226 (FIG. 6) of hard mask portions 224 (FIG. 6) that define cavity 330 (FIG. 5), resulting in an intermediate structure 500 (FIG. 7) having cavities 530. For example, a spacer layer may be deposited on the upper surface of intermediate structure 300 (FIG. 5), vertical sides of cavities 330 (FIG. 5), and bottoms of cavities 330 (FIG. 5). Thereafter, the horizontal surfaces of spacer layer may be selectively removed. Spacers 400 may be SOH, amorphous carbon, TiN, or other suitable material.

Figure 9:
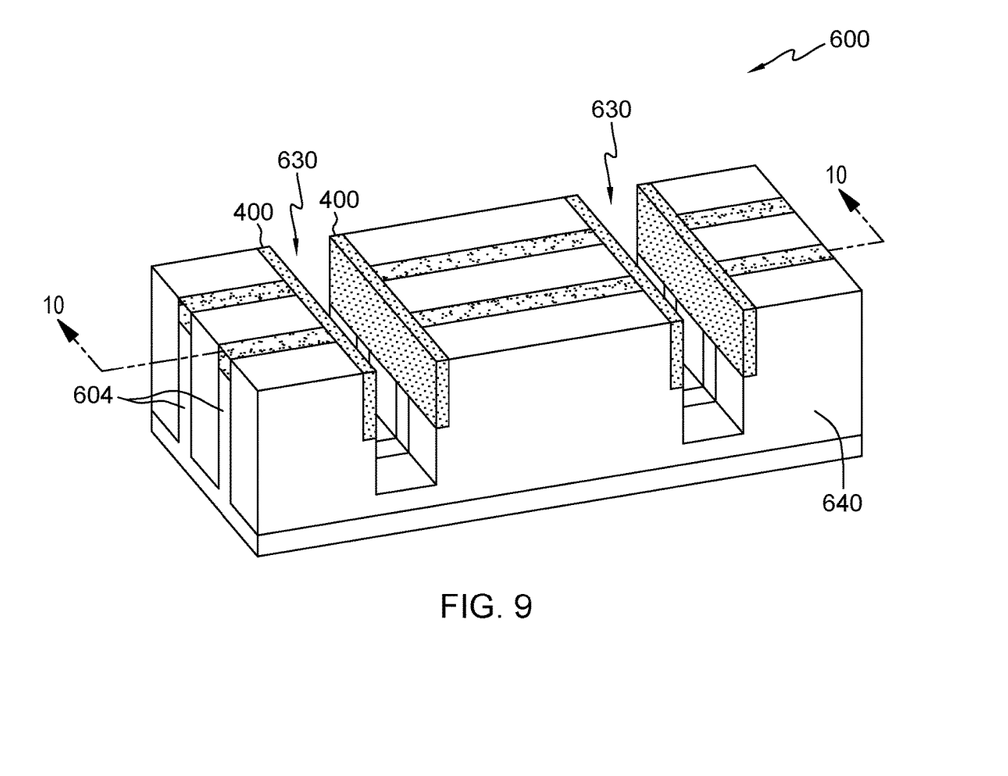
Figure 10:
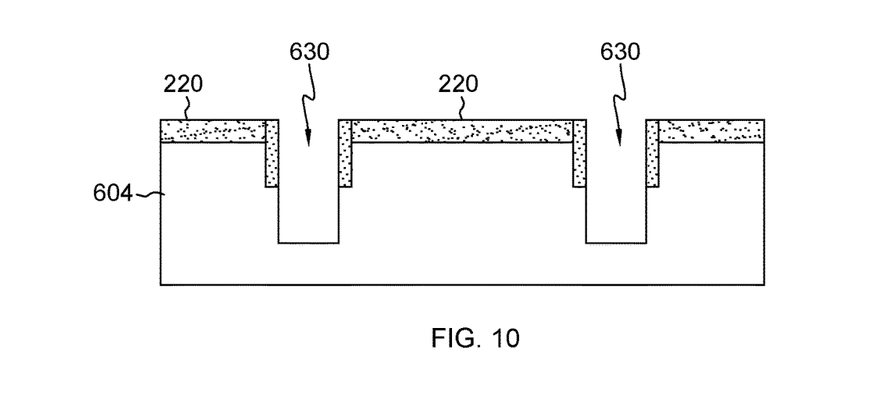

A removal or etching process such as an etch down may be performed on intermediate structure 500 (FIG. 7) to enlarge cavities 530 (FIG. 7) extending across structure 500 (FIG. 7). For example, as shown in FIGS. 9 and 10, a removal or etching process may be performed resulting in an intermediate structure 600 (FIG. 9) having a plurality of enlarged cavities 630 which extend across intermediate structure 600 (FIG. 9 and further into the structure compared to intermediate structure 500 (FIG. 7). The size of the portion of cavity 630 disposed between spacers 400 remains the same. For example, the removal or etching process results in structure 600 (FIG. 9) having a plurality of fins 604, a fill material 640 (FIG. 9), hard masks 220 (FIG. 10), and spacers 400 (FIG. 9). The removal or etching process to enlarge cavities 530 (FIG. 7) to form cavities 630 may include an anisotropic etch process such as an HF etch.

Figure 11:
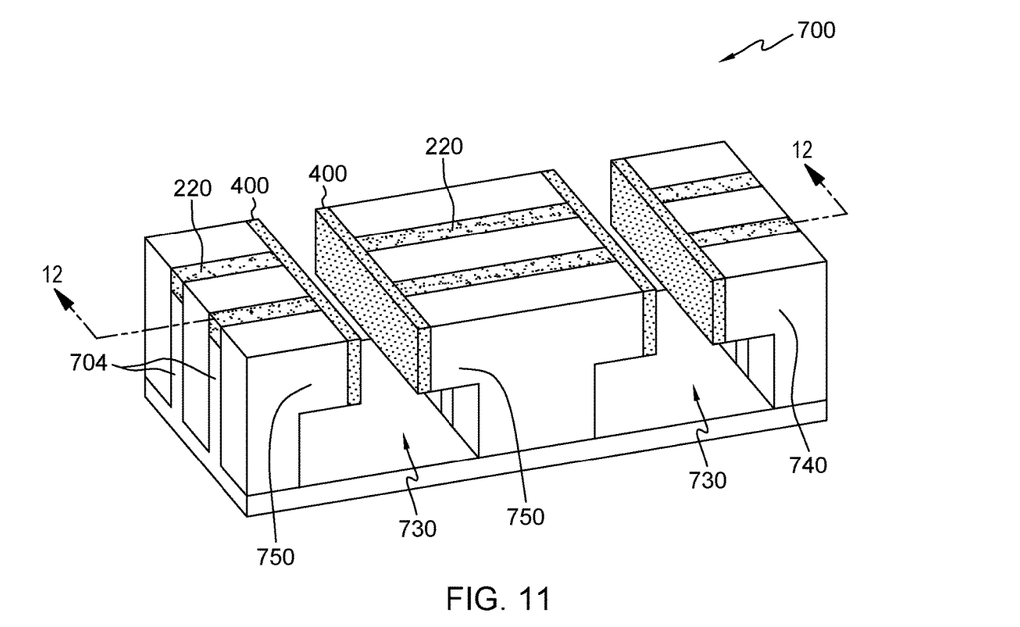
Figure 12:
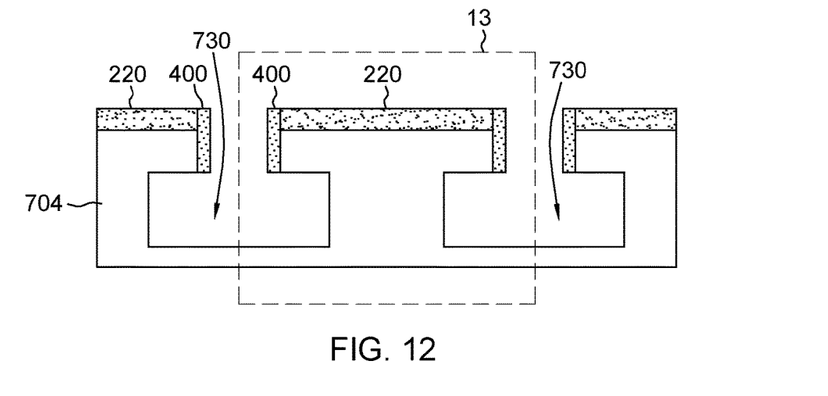

A removal or etching process may be performed on intermediate structure 600 (FIG. 9) to enlarge cavities 630 (FIG. 9) extending across structure 600 (FIG. 9) so that a resulting intermediate structure 700 as shown in FIG. 11 has a plurality of enlarged cavities 730 which extend across intermediate structure 700 in an enlarged vertical and horizontal direction compared to cavities 630 (FIG. 9) of intermediate structure 600 (FIG. 9). As shown in FIGS. 11 and 12, structure 700 (FIG. 11) includes a plurality of fins 704, a fill material 740 (FIG. 11), hard masks 220, and spacers 400. In addition, intermediate structure 700 defines cantilevered or overhanging portions 750 in intermediate structure 700 (FIG. 11). The size of the portion of cavity 730 (FIG. 11) disposed between spacers 400 remains the same. The removal or etching process to enlarge cavities 630 (FIG. 9) to form cavities 730 may be an anisotropic etch process or other suitable etch process. It will be appreciated that a single etch process may be employed to provide and etch down and etch outward below the spacers and into portions of the fins and the fill material. For example, an isotropic etch may be performed on structure 500 (FIG. 7).

Figure 13:
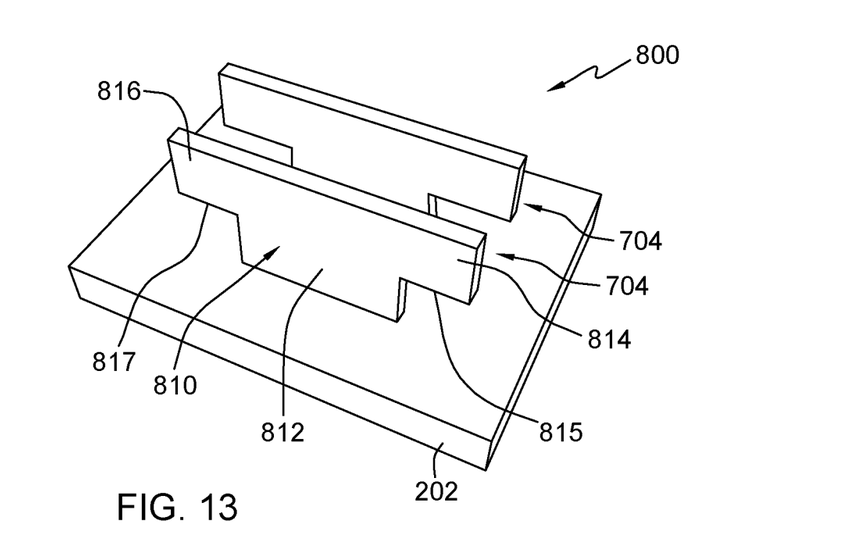

Hard masks 220, spacers 400, and fill material 740 are removed resulting in, as shown in FIG. 13, an intermediate structure 800 having a substrate 202 and plurality of fins 810. Intermediate structure 800 corresponds to the dashed portions illustrated in FIG. 12. The removal process may include one or more etch suitable processes. As shown in FIG. 13, fins 704 may include spaced apart T-shaped fin 810 having a web portion 812, a first overhanging fin portion 814 having a lower surface 815, and a second overhanging fin portion 816 having a lower surface 817. The first overhanging fin portion, the web portion, and the second overhanging fin portion may be aligned in the longitudinally direction of the fins. The T-shaped fin may have a front longitudinal face and a rear longitudinal face, and the overhanging fin portions extend from the front longitudinal face to the rear longitudinal face with undercuts below extending from the front longitudinal face to the rear longitudinal face.

Figure 14:
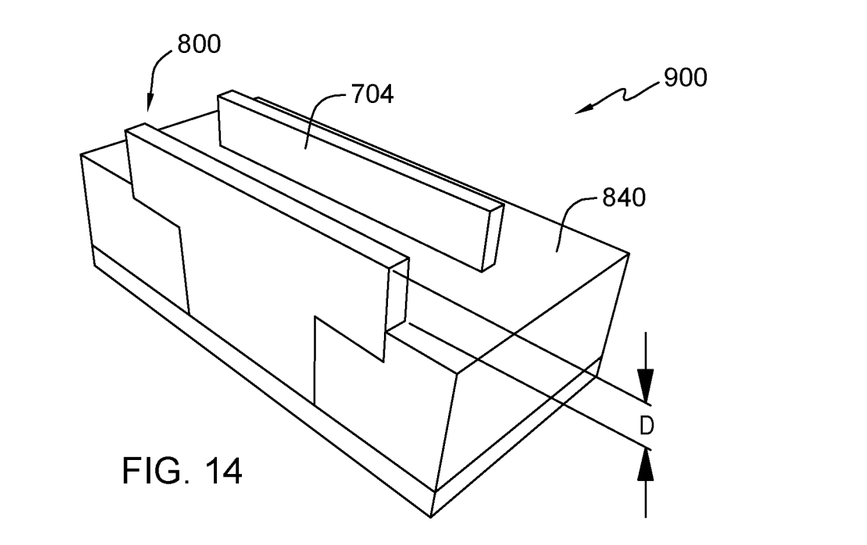

With reference to FIG. 14, an isolation material 840 is deposited on intermediate structure 800 so that fill material 840 is disposed between plurality of fins 810 resulting in an intermediate structure 900 (a front portion of structure 900 being removed in FIG. 14 to better illustrate one of the plurality of fins 810). An upper surface of fill material 840 may be disposed below an upper surface of the plurality of fins 840. For example, the upper surface of fill material 840 may be disposed a distance D below the upper surface of the plurality of fins. Fill material 840 may be a flowable oxide. In other embodiments, the hard masks may remain during the process of the intermediate structures shown in FIGS. 13 and 14.

Figure 15:
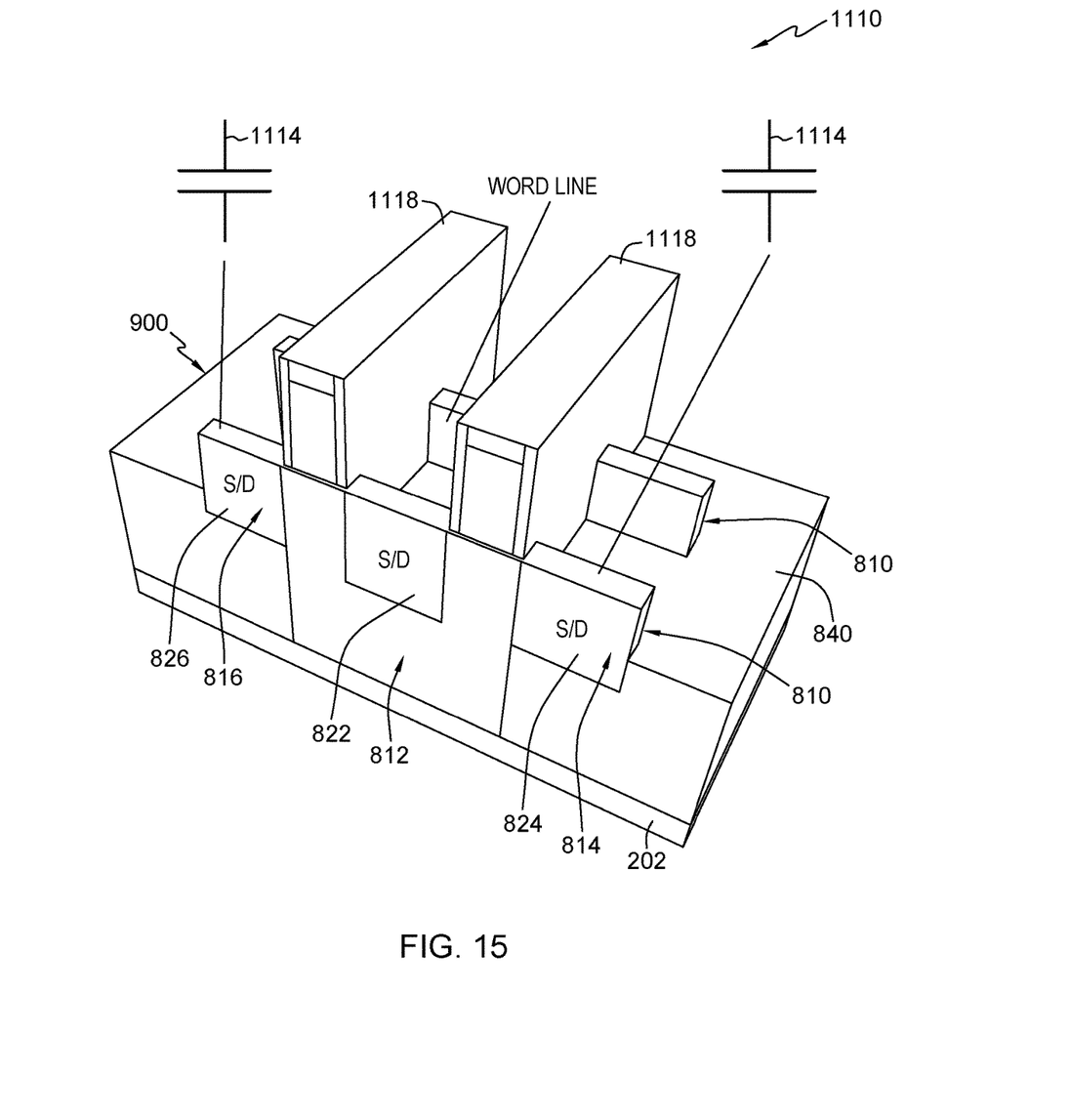

FIG. 15 illustrates semiconductor memory device 1110 which includes structure 900 forming a portion of the memory cell. A plurality of source/drain regions may be formed in the fins. For example, a first source/drain region 814 may be formed in first overhanging fin portion 814 of T-shaped fin 810, a second source/drain region 826 may be formed in second overhanging fin portion 816 of T-shaped fin 810, and a third source/drain region 822 may be formed in web portion 812 of T-shaped fin 810. For example, dopants may be implanted in the fin to form the source/drain regions. The dopants may be provide in the initial substrate prior to forming the fins, after forming the plurality of fins, or at any suitable time in the process. One or more gates 1118 may be disposed on the upper surface of isolation material 840 and over the one or more fins 810. Some of the source/drain region may be electrically connected to a respective capacitor 1114. The technique of the present disclosure may reduce leakage in a storage capacitor for memory cells such as DRAM cells and eDRAM cells by increasing the electrical resistance below source/drain regions electrically connected to respective capacitors.

Figure 16:
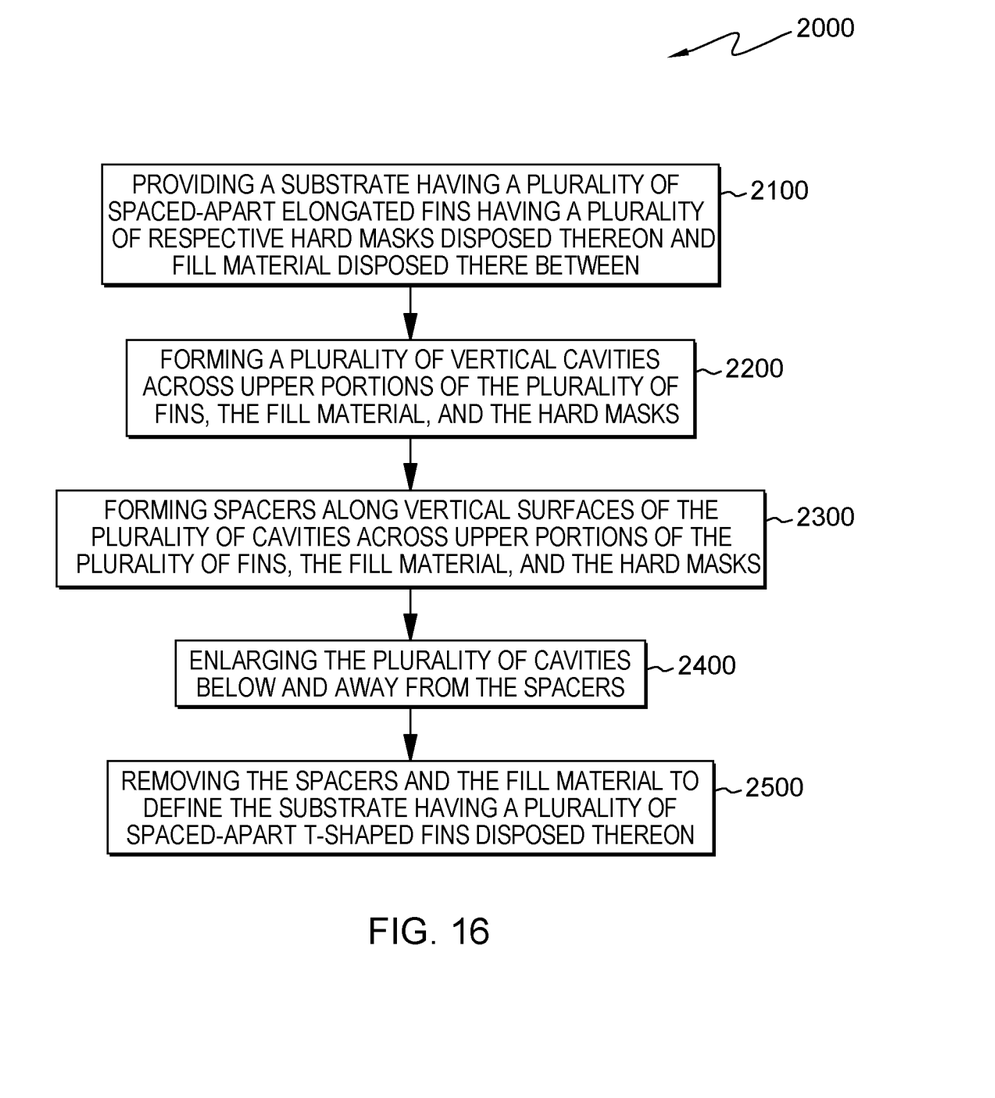
FIG. 16 is a flowchart illustrating a method for use in forming a semiconductor memory device having an undercut source/drain region according to an embodiment of the present disclosure.

FIG. 16 is a flowchart of a method 2000 according to an embodiment of the present disclosure, which may be similar to aspects of the method shown in FIGS. 3-15. For example, in this exemplary embodiment, method 2000 may include at 2100 providing a substrate having a plurality of spaced-apart elongated fins having a plurality of respective hard mask disposed thereon and fill material disposed therebetween, at 2200 forming a plurality of vertical cavities across upper portions of the plurality of fins, the fill material, and the hard masks, at 2300 forming spacers along vertical surfaces of the plurality of cavities across upper portions of the plurality of fins, the fill material, and the hard masks, at 2400 enlarging the plurality of cavities below and away from the spacers, and at 2500 removing the spacers and the fill material to define the substrate having a plurality of spaced-apart T-shaped fins disposed thereon.

Method 2000 may further include providing an isolation material extending between the plurality of spaced-apart T-shaped fins and extending under the overhanging fin portions, and an upper surface of the isolation material being below upper surfaces of the plurality of spaced-apart T-shaped fins. The method may include forming a plurality of source/drain regions in the overhanging fin portions of the plurality of fin, forming a plurality of gates disposed over the plurality of fins and adjacent to the plurality of source/drain regions, and connecting a plurality of capacitors to the plurality of source/drain regions. Method 2000 may further include forming first source/drain regions in first overhanging fin portions of the plurality of spaced-apart T-shaped fins, forming second source/drain regions in a second overhanging fin portions of the plurality of spaced-apart T-shaped fins, forming source/drain regions in a web portion of the plurality of spaced-apart T-shaped fins between the first source/drain regions and the second source/drain regions. Method 2000 may further include forming first gates between the first plurality of source/drain regions and the source/drain regions disposed in the web portion of the plurality of spaced-apart T-shaped fins, and forming second gates between the second plurality of source/drain regions and the source/drain regions disposed in the web portion of the plurality of spaced-apart T-shaped fins.

Figure 17:
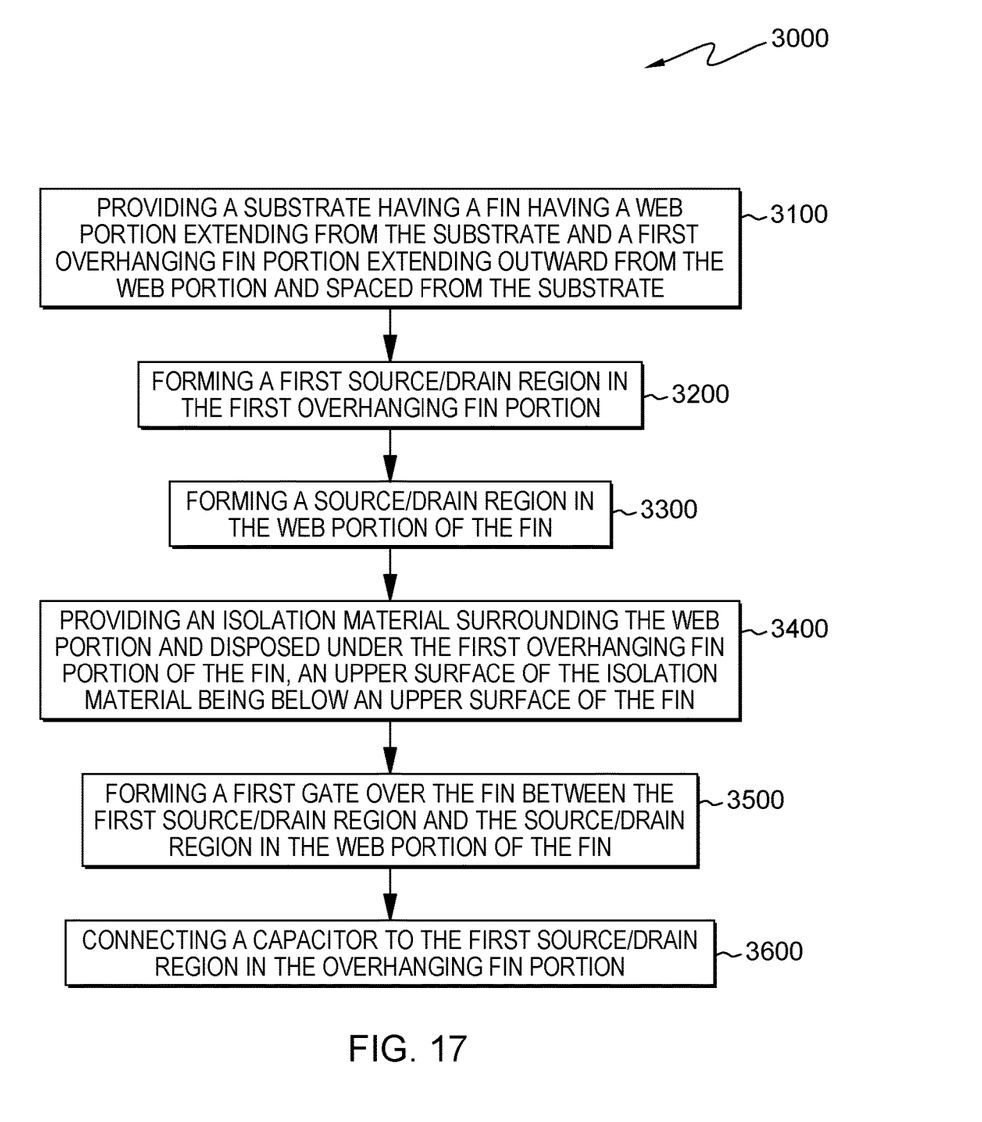
FIG. 17 is a flowchart illustrating a method for use in forming a semiconductor memory device having an undercut source/drain region according to an embodiment of the present disclosure.

FIG. 17 is a flowchart of a method 3000 according to an embodiment of the present disclosure, which may be similar to aspects of the method shown in FIGS. 3-15. For example, in this exemplary embodiment, method 3000 may include at 3100 providing a substrate having a fin having a web portion extending from the substrate and a first overhanging fin portion extending outward from the web portion and spaced from the substrate, at 3200 forming a first source/drain region in the first overhanging fin portion, at 3300 forming a source/drain region in the web portion of the fin, at 3400 providing an isolation material surrounding the web portion and disposed under the first overhanging fin portion of the fin, an upper surface of the isolation material being below an upper surface of the fin, at 3500 forming a first gate over the fin between the first source/drain region and the source/drain region in the web portion of the fin, and at 3600 connecting a capacitors to the first source/drain region in the overhanging fin portion.

In method 3000, the providing the substrate may include providing the substrate having the fin having a second overhanging fin portion extending outward from the web portion and spaced from the substrate. Method 3000 may further include forming a second source/drain region in the second overhanging fin portion. The providing the isolation material may include providing the isolation material disposed under the second overhanging fin portion of the fin. The method may further include forming a second gate over the fin between the source/drain region in the web portion of the fin and the second source/drain region. A second capacitor may be connected to the second source/drain region in the second overhanging fin portion.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:

1. A method comprising:
providing a substrate having a plurality of spaced-apart elongated fins having a plurality of respective hard masks disposed thereon and fill material disposed therebetween;
forming a plurality of vertical cavities having vertical sides across upper portions of the plurality of fins, the fill material, and the hard masks;
forming spacers along the vertical sides of the plurality of cavities across upper portions of the plurality of fins, the fill material, and the hard masks;
enlarging the plurality of cavities below and away from the spacers; and
removing the spacers and the fill material to define the substrate having a plurality of spaced-apart T-shaped fins disposed thereon.

2. The method of claim 1 further comprising providing an isolation material extending between the plurality of spaced-apart T-shaped fins and extending under overhanging fin portions, an upper surface of the isolation material being below upper surfaces of the plurality of spaced-apart T-shaped fins.

3. The method of claim 2 further comprising forming a plurality of source/drain regions in the overhanging fin portions of the plurality of fins.

4. The method of claim 3 further comprising forming a plurality of gates disposed over the plurality of fins and adjacent to the plurality of source/drain regions.

5. The method of claim 4 further comprising connecting a plurality of capacitors to the plurality of source/drain regions in the overhanging fin portions of the plurality of fins.

6. The method of claim 2 further comprising forming first source/drain regions in first overhanging fin portions of the plurality of spaced-apart T-shaped fins, forming second source/drain regions in a second overhanging fin portions of the plurality of spaced-apart T-shaped fins, forming source/drain regions in a web portion of the plurality of spaced-apart T-shaped fins between the first source/drain regions and the second source/drain regions.

7. The method of claim 6 further comprising forming first gates between the first plurality of source/drain regions and the source/drain regions disposed in the web portion of the plurality of spaced-apart T-shaped fins, and forming second gates between the second plurality of source/drain regions and the source/drain regions disposed in the web portion of the plurality of spaced-apart T-shaped fins.

8. A method comprising:
providing a substrate having a fin having a web portion extending from the substrate and a first overhanging fin portion extending outward from the web portion and spaced from the substrate;
forming a first source/drain region in the first overhanging fin portion;
forming a source/drain region in the web portion of the fin;
providing an isolation material surrounding the web portion and disposed under the first overhanging fin portion of the fin, an upper surface of the isolation material being below an upper surface of the fin;
forming a first gate over the fin between the first source/drain region and the source/drain region in the web portion of the fin; and
connecting a capacitor to the first source/drain region in the overhanging fin portion.

9. The method of claim 8 wherein the providing the substrate comprises providing the substrate having the fin having a second overhanging fin portion extending outward from the web portion and spaced from the substrate.

10. The method of claim 9 further comprising forming a second source/drain region in the second overhanging fin portion.

11. The method of claim 10 wherein the providing the isolation material comprises further providing the isolation material disposed under the second overhanging fin portion of the fin.

12. The method of claim 11 further comprising forming a second gate over the fin between the source/drain region in the web portion of the fin and the second source/drain region.

13. The method of claim 11 further comprising connecting a second capacitor to the second source/drain region in the second overhanging fin portion.

* * * * *